(12) United States Patent
Yamaguchi

(10) Patent No.: US 8,508,628 B2
(45) Date of Patent: Aug. 13, 2013

(54) SOLID-STATE IMAGE SENSING DEVICE AND METHOD OF MANUFACTURING THE SAME

(75) Inventor: Tetsuya Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 12/877,654

(22) Filed: Sep. 8, 2010

(65) Prior Publication Data

US 2011/0090383 A1 Apr. 21, 2011

(30) Foreign Application Priority Data

Oct. 19, 2009 (JP) ................................. 2009-240607

(51) Int. Cl.
*H04N 5/217* (2011.01)
*H04N 3/14* (2006.01)

(52) U.S. Cl.
USPC ........... 348/241; 348/308; 348/302; 348/294; 257/291

(58) Field of Classification Search
USPC .................................. 348/308, 302, 241, 294
See application file for complete search history.

(56) References Cited

U.S. PATENT DOCUMENTS

| | | | |
|---|---|---|---|
| 6,454,395 B1 * | 9/2002 | Irinoda | 347/54 |
| 8,334,552 B2 * | 12/2012 | Oshiyama et al. | 257/228 |
| 2003/0214595 A1 | 11/2003 | Mabuchi | |
| 2006/0033827 A1 * | 2/2006 | Kanbe et al. | 348/302 |
| 2006/0187327 A1 * | 8/2006 | Mabuchi et al. | 348/294 |
| 2006/0209915 A1 * | 9/2006 | Shima | 372/46.01 |
| 2008/0001179 A1 * | 1/2008 | Roy | 257/228 |
| 2008/0308890 A1 * | 12/2008 | Uya | 257/437 |
| 2009/0090988 A1 | 4/2009 | Ohgishi | |
| 2009/0201395 A1 * | 8/2009 | Manabe et al. | 348/294 |

FOREIGN PATENT DOCUMENTS

| | | |
|---|---|---|
| JP | 61-196542 | 8/1986 |
| JP | 61-40035 | 9/1986 |
| JP | 2006-128392 | 5/2006 |

OTHER PUBLICATIONS

Search Report issued Aug. 25, 2012 in Chinese Patent Application No. 201010274493.X (with English translation).
U.S. Appl. No. 12/980,769, filed Dec. 29, 2010, Yamaguchi.
Hidetoshi Nozaki, et al. "Hg-Sensitized Photochemical Vapor Deposition Application to Hydrogenated Amorphous Silicon Photoconversion Layer Overlaid on Charge Coupled Device." Jpn. J. Appl. Phys. vol. 34. Part 1. No. 5A. May 1995. pp. 2223-2228.
Office Action issued on Feb. 25, 2013 in the corresponding Chinese Patent Application No. 201010274493.X (with English Translation).

* cited by examiner

*Primary Examiner* — Hung Lam
(74) *Attorney, Agent, or Firm* — Oblon, Spivak, McClelland, Maier & Neustadt, L.L.P.

(57) ABSTRACT

According to one embodiment, a back side illumination solid-state image sensing device which comprises a pixel region where a plurality of pixels each including a photoelectric converter and a signal scanning circuit are arranged on a semiconductor substrate, and in which a light illumination surface is formed on a substrate surface opposite to a surface of the semiconductor substrate on which the signal scanning circuit is formed, includes a silicon oxide film formed on the semiconductor substrate on the light illumination surface side, a p-type amorphous silicon compound layer formed on the silicon oxide film, and a hole storage layer formed by the p-type amorphous silicon compound layer near an interface between the semiconductor substrate on the light illumination surface side and the silicon oxide film.

14 Claims, 10 Drawing Sheets

Sectional structure example (first embodiment)

Overall configuration example

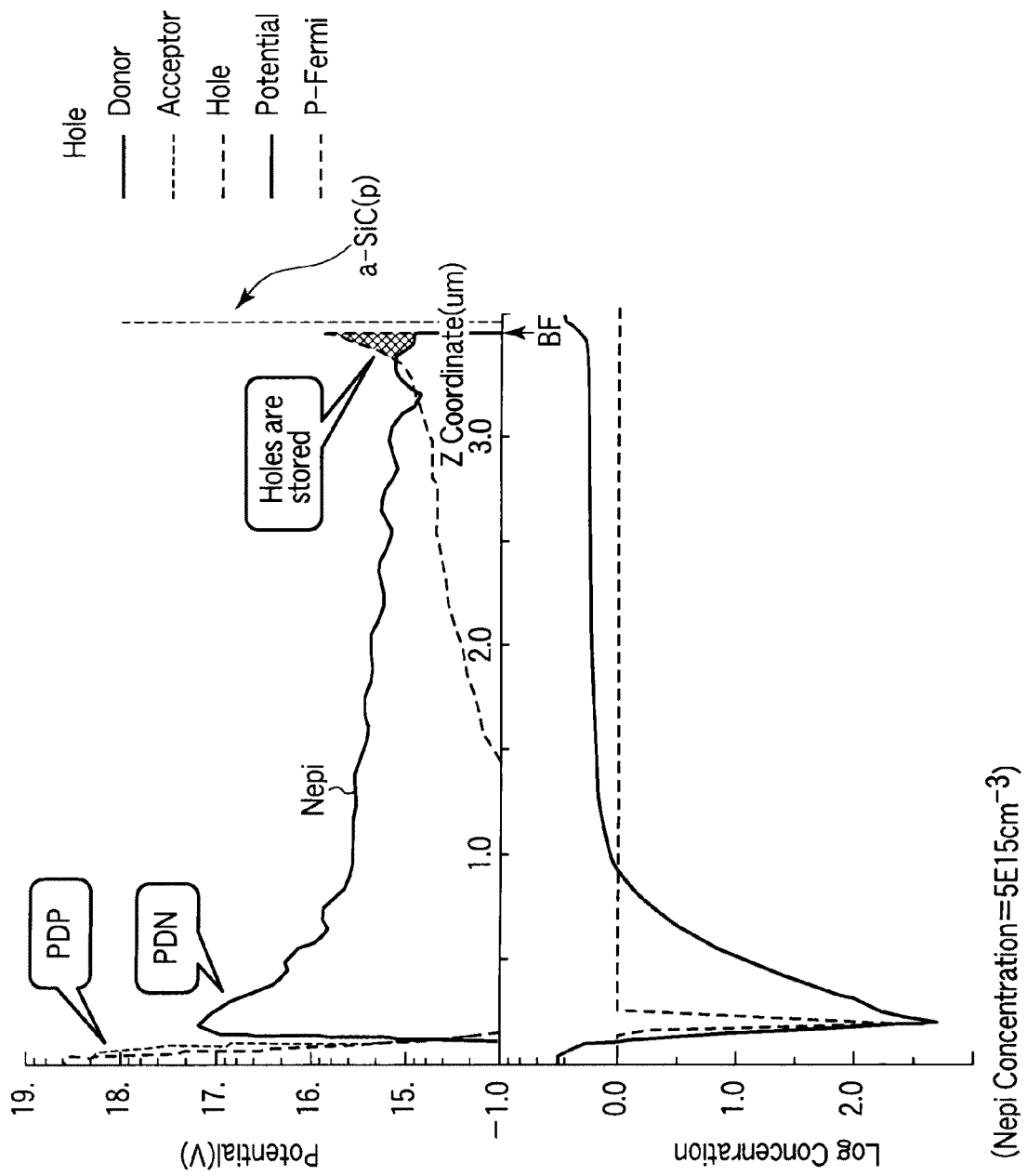
F I G. 4

Manufacturing method (first embodiment)

Deposition method and characteristics of a-SiC(p) layer

| | |
|---|---|
| $CH_4$ : | 40SCCM |
| $H_2$ : | 80SCCM |
| $SiH_4$ : | 10SCCM |
| $B_2H_6$(2500ppm) | 20SCCM |
| Pressure | 0.35Torr |
| Power | 20W |
| Substrate temperature | 230°C |
| Eg-opt (optical bandgap) | 2.0eV |
| Ea (activation energy) | 0.6eV |

FIG. 9

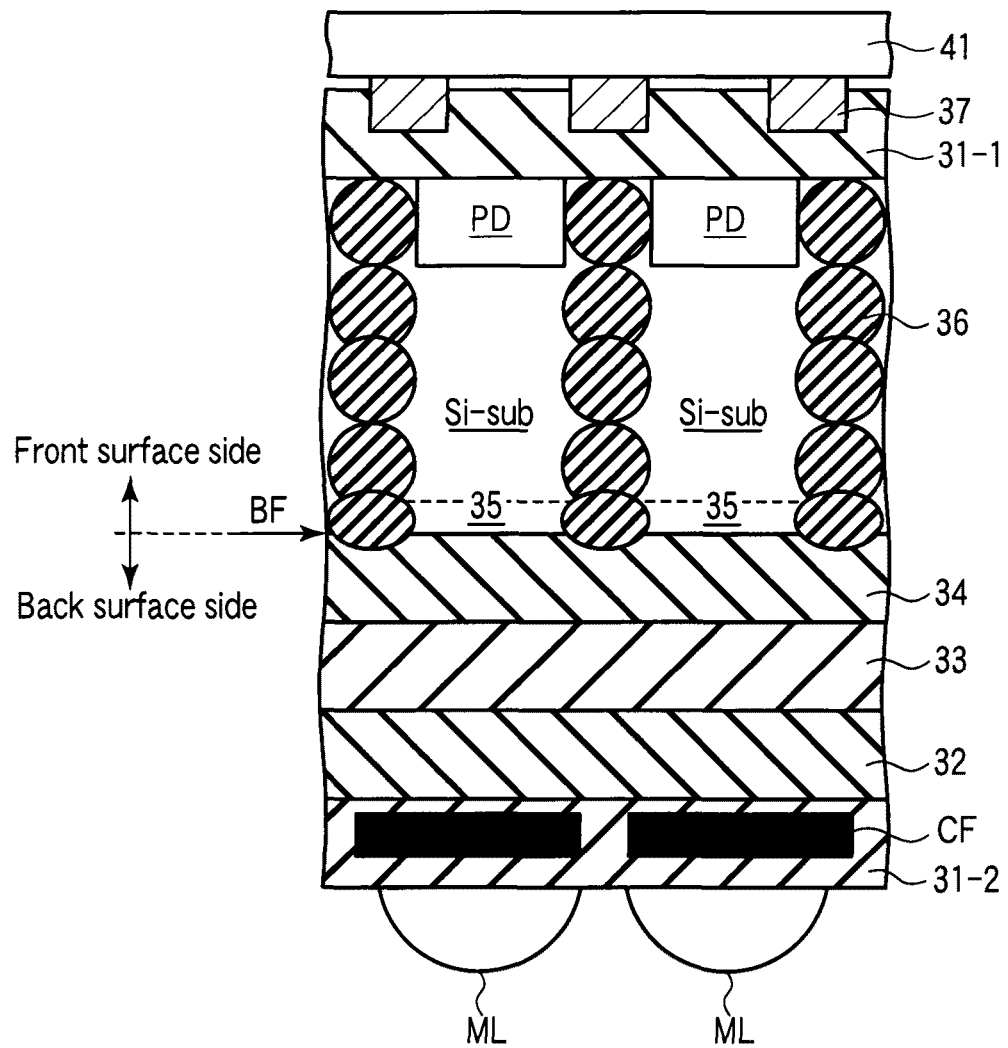
F I G. 10

Sectional structure example (second embodiment)

SOLID-STATE IMAGE SENSING DEVICE AND METHOD OF MANUFACTURING THE SAME

CROSS-REFERENCE TO RELATED APPLICATIONS

This application is based upon and claims the benefit of priority from Japanese Patent Application No. 2009-240607, filed Oct. 19, 2009; the entire contents of which are incorporated herein by reference.

FIELD

Embodiments described herein relate generally to a solid-state image sensing device and a method of manufacturing the same, e.g., a back side illumination solid-state image sensing device.

BACKGROUND

Recently, as the micropatterning of pixels advances, a back side illumination solid-state image sensing device whose main purpose is to increase the aperture ratio has been proposed.

In this back side illumination solid-state image sensing device, electrons generated on the light illumination surface side are not counted as signals unless they arrive at photodiodes (PDs) on the interconnection side. Therefore, the thickness of an Si layer for performing photoelectric conversion determines the sensitivity (the larger the film thickness of the silicon (Si) layer, the higher the sensitivity).

BRIEF DESCRIPTION OF THE DRAWINGS

FIG. 4 is a graph showing the concentration distribution and potential in the direction of depth from the semiconductor substrate surface to the vicinity of an interface according to the first embodiment;

FIG. 9 is a graph showing the deposition method and characteristics of the a-SiC(p) layer according to the first embodiment;

FIG. 10 is a view showing still another manufacturing step of the solid-state image sensing device according to the first embodiment;

DETAILED DESCRIPTION

Figure 1:
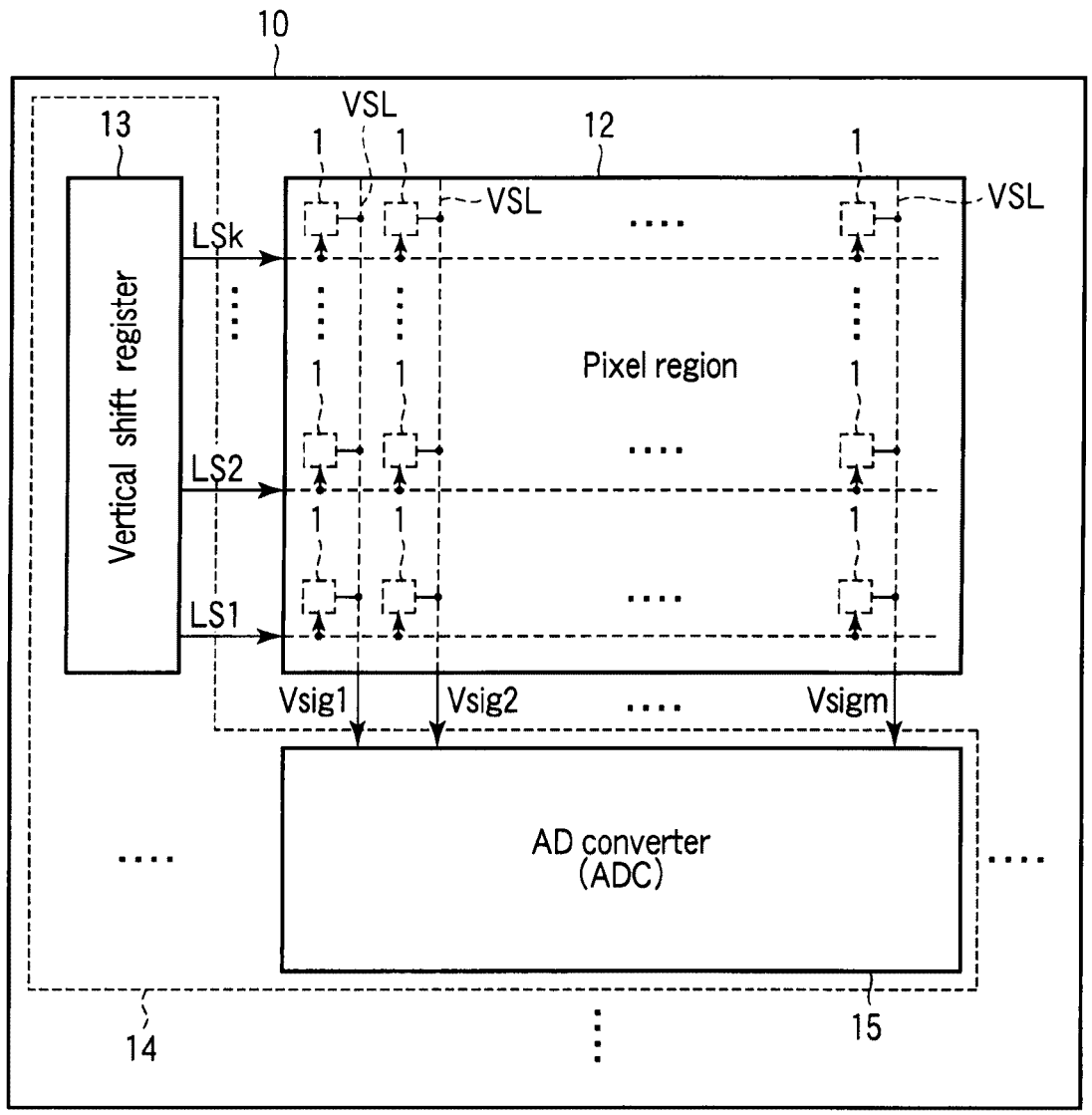
FIG. 1 is a block diagram showing an overall configuration example of a solid-state image sensing device according to the first embodiment.

In general, according to one embodiment, a solid-state image sensing device according to an aspect of an embodiment is a back side illumination solid-state image sensing device which includes a pixel region where a plurality of pixels each including a photoelectric converter and a signal scanning circuit are arranged on a semiconductor substrate, and in which a light illumination surface is formed on a substrate surface opposite to a surface of the semiconductor substrate on which the signal scanning circuit is formed, comprising a silicon oxide film formed on the semiconductor substrate on the light illumination surface side, a p-type amorphous silicon compound layer formed on the silicon oxide film, and a hole storage layer formed by the p-type amorphous silicon compound layer near an interface between the semiconductor substrate on the light illumination surface side and the silicon oxide film.

If depletion occurs in the Si interface on the light illumination surface side of the back side illumination solid-state image sensing device described above, an increase in dark current caused by generation centers existing in the interface often largely degrades the image quality. Examples of the reproduction image quality deterioration caused by the increase in dark current are white defects and dark signal non-uniformity.

Accordingly, a method of forming a back side illumination solid-state image sensing device by using a substrate obtained by forming a p-type semiconductor layer on an SOI substrate and epitaxially growing Si on the p-type semiconductor layer so as not to deplete the interface on the light illumination surface side has been proposed. When the p-type semiconductor layer is formed on the light illumination side of the substrate, however, boron (B) in the p-type semiconductor layer diffuses in a heating step of the process of forming a CMOS sensor (by using the substrate obtained by forming the p-type semiconductor layer on the substrate), and the film thickness of the p-type semiconductor layer practically increases. If the above-mentioned p-type semiconductor layer becomes thick, the sensitivity to blue (B) (450 nm) light significantly decreases.

Also, a method of forming a negative fixed charge film (e.g., a hafnium oxide film) in order to prevent the depletion of the Si layer near the interface on the light illumination surface side has been proposed. This method forms a hole layer in the Si layer near the interface (i.e., prevents the depletion of the interface and its vicinity) by forming a negative fixed charge film, thereby suppressing the increase in dark current. However, a method of forming a fixed charge film having a sufficient hole density is not easy.

As described above, the solid-state image sensing device and the method of manufacturing the same described above are often disadvantageous in preventing the depletion of the light illumination surface side, and reducing the dark current.

Accordingly, embodiments will be explained below with reference to the accompanying drawings. In the following embodiments, a back side illumination solid-state image sensing device in which a light illumination surface (light receiving surface) is formed on the back surface of a semiconductor substrate which is opposite to the front surface of the semiconductor substrate on which a signal scanning circuit is formed will be explained as an example. Note that the same reference numerals denote the same parts throughout the drawings.

[First Embodiment]

<1. Configuration Example>

A configuration example of a solid-state image sensing device according to the first embodiment of the present invention will be explained below with reference to FIGS. 1, 2, 3, 4, 5, and 6.

1-1. Overall Configuration Example

First, an overall configuration example of the solid-state image sensing device according to this embodiment will be explained with reference to FIG. 1. FIG. 1 is a system block diagram showing the overall configuration example of the solid-state image sensing device according to this embodiment. FIG. 1 shows an arrangement in which an AD converter is placed in the column position of a pixel region.

As shown in FIG. 1, a solid-state image sensing device 10 according to this embodiment includes a pixel region 12 and driver region 14.

In the pixel region 12, unit pixels 1 each including a photoelectric converter and signal scanning circuit are arranged in a matrix on a semiconductor substrate.

The photoelectric converter includes a photodiode for photoelectric conversion and storage, and functions as an image sensor. The signal scanning circuit includes an amplification transistor (to be described later) and the like. The signal scanning circuit reads out a signal from the photoelectric converter, amplifies the readout signal, and transmits the amplified signal to an AD converter 15. In this embodiment, the light illumination surface (photoelectric converter) is formed on the back surface side of the semiconductor substrate, which is opposite to the semiconductor substrate front surface on which the signal scanning circuit is formed.

The driver region 14 is formed by arranging drivers such as a vertical shift register 13 for driving the signal scanning circuit, and the AD converter.

The vertical shift register 13 functions as a selector that outputs signals LS1 to LSk to the pixel region 12, and selects the unit pixels 1 for each row. Each unit pixel 1 of the selected row outputs an analog signal Vsig corresponding to the amount of incident light via a vertical signal line VSL.

The AD converter (ADC) 15 converts the analog signal Vsig input via the vertical signal line VSL into a digital signal.

Note that FIG. 1 shows a portion of the overall configuration of the solid-state image sensing device, and the rest are not shown in FIG. 1 and an explanation thereof is omitted. However, the present invention is not limited to this. For example, the solid-state image sensing device may further include, e.g., a controller for controlling the operation of the pixel region 12 and the like. It is also possible to adopt an arrangement in which the ADC is not formed parallel to the column but formed on the chip level, or an arrangement in which no ADC is formed on the sensor chip.

1-2. Configuration Example of Pixel Region

A configuration example of the pixel region 12 shown in FIG. 1 will be explained below with reference to FIG. 2. This embodiment will be explained by taking, as an example, a 1CCD image sensing element that acquires a plurality of pieces of color information in one pixel region 12.

Figure 2:
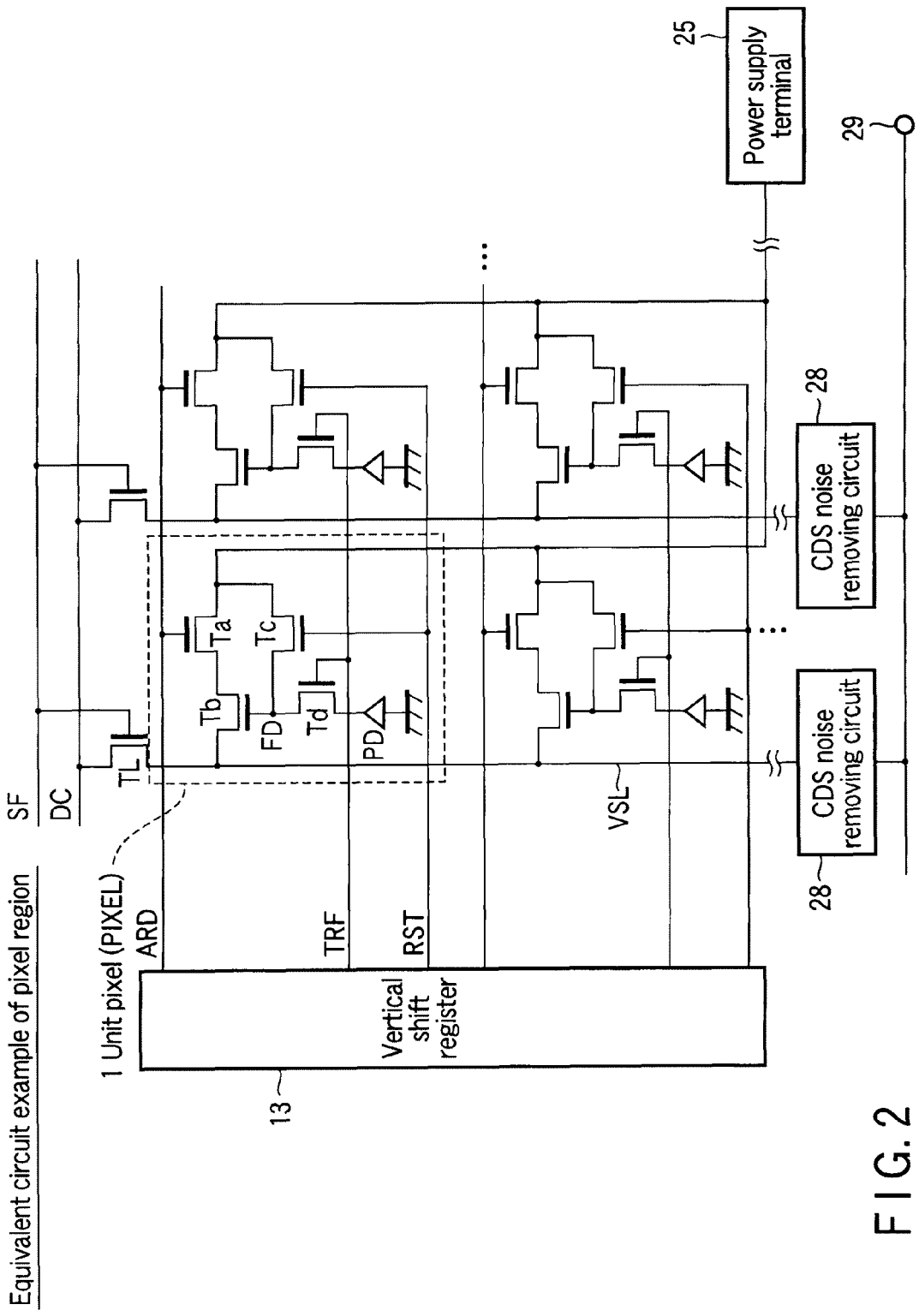
FIG. 2 is an equivalent circuit diagram showing a pixel region of the solid-state image sensing device according to the first embodiment.

As shown in FIG. 2, the pixel region 12 includes the plurality of unit pixels 1 arranged in a matrix at the intersections of read signal lines from the vertical shift register 13 and the vertical signal lines VSL.

The unit pixel (PIXEL) 1 includes a photodiode PD, amplification transistor Tb, read transistor Td, reset transistor Tc, and address transistor Ta.

In the above-mentioned arrangement of the pixel 1, the photodiode PD forms a photoelectric converter. The amplification transistor Tb, read transistor Td, reset transistor Tc, and address transistor Ta form a signal scanning circuit.

A reference potential Vss is applied to the cathode of the photodiode PD.

The amplification transistor Tb amplifies a signal from a floating diffusion layer (detector) FD, and outputs the amplified signal. The amplification transistor Tb has a gate connected to the floating diffusion layer FD, a source connected to the vertical signal line VSL, and a drain connected to the source of the address transistor Ta. A CDS noise removing circuit 28 removes noise from an output signal transmitted from the unit pixel 1 via the vertical signal line VSL. After that, the signal is output from an output terminal 29.

The read transistor Td controls the storage of signal charge in the photodiode PD. The read transistor Td has a gate connected to a read signal line TRF, a source connected to the anode of the photodiode PD, and a drain connected to the floating diffusion layer FD.

The reset transistor Tc resets the gate potential of the amplification transistor Tb. The reset transistor Tc has a gate connected to a reset signal line RST, a source connected to the floating diffusion layer FD, and a drain connected to a power supply terminal 25 connected to a drain power supply.

The gate of the address transistor Ta is connected to an address signal line ADR.

A load transistor TL has a gate connected to a selection signal line SF, a drain connected to the source of the amplification transistor Tb, and a source connected to a control signal line DC.

Read Driving Operation

A read driving operation performed by the structure of the pixel region 12 is as follows. First, the address transistor Ta of a read row is turned on by a row selection pulse supplied from the vertical shift register 13.

Subsequently, the reset transistor Tc is turned on by a reset pulse similarly supplied from the vertical shift register 13, and reset to a voltage close to the potential of the floating diffusion layer FD. After that, the reset transistor Tc is turned off.

Then, a transfer gate 4 is turned on to read out signal charges stored in the photodiode PD to the floating diffusion layer FD, and the potential of the floating diffusion layer FD is modulated in accordance with the number of the readout signal charges.

The modulated signal is read out to the vertical signal line VSL by a MOS transistor forming a source follower, thereby completing the read operation.

1-3. Sectional Structure Example

Figure 3:
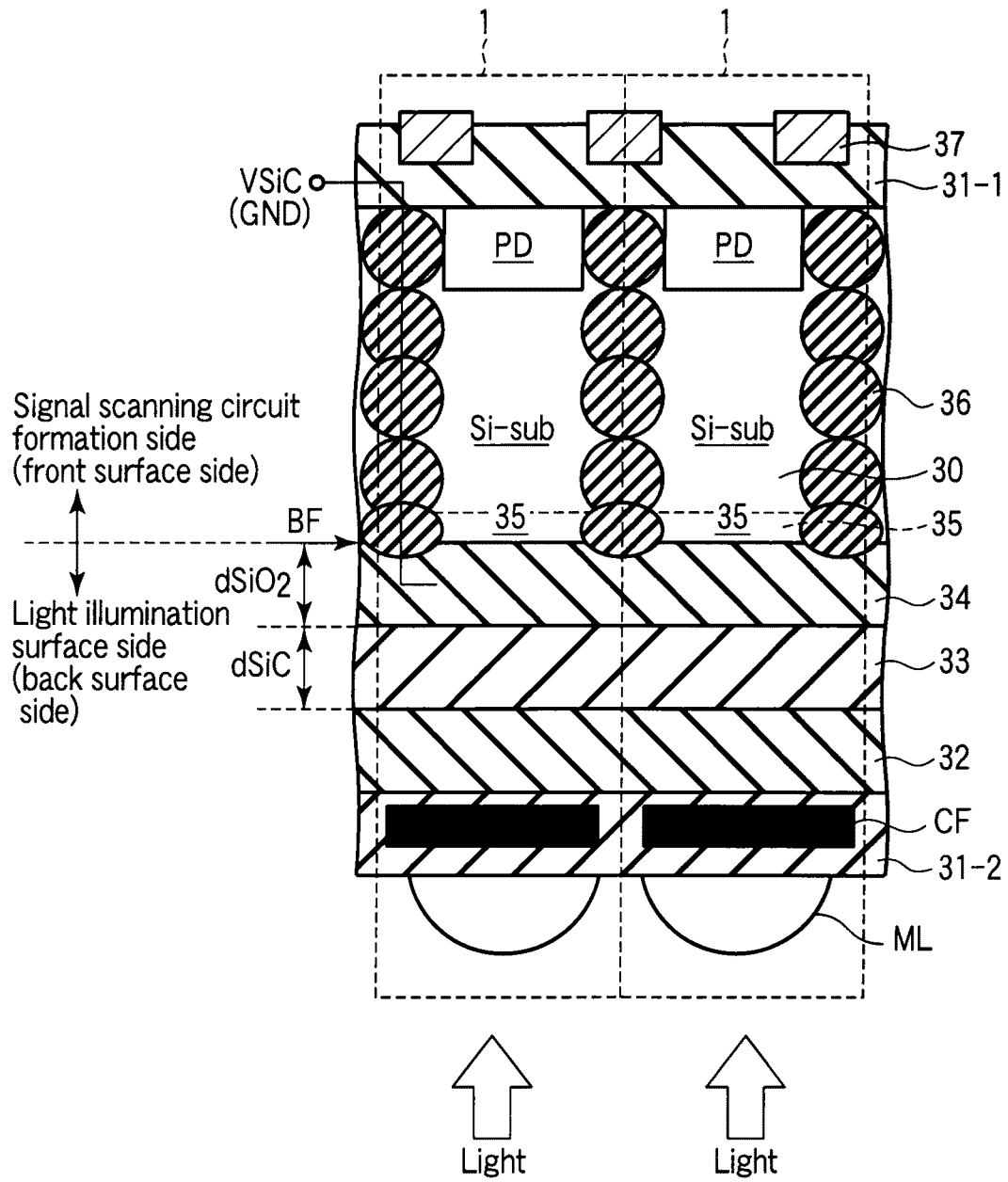
FIG. 3 is a sectional view showing a sectional structure example of the solid-state image sensing device according to the first embodiment.

A sectional structure example of the solid-state image sensing device according to this embodiment will be explained below with reference to FIG. 3.

As described above, the unit pixels 1 are separated by a pixel separating layer 36, and each unit pixel 1 includes the photoelectric converter and signal scanning circuit. The pixel separating layer 36 is made of a p-type semiconductor layer of, e.g., B (boron) diffused in a semiconductor substrate (Si-sub) 30.

The photoelectric converter includes the photodiode PD and a hole storage layer 35 formed in the semiconductor substrate 30, and a silicon oxide film 34, a p-type amorphous silicon carbide layer 33 as a p-type amorphous silicon compound layer, a planarizing layer 32, a color filter CF, and a microlens ML formed on the surface of the semiconductor substrate 30 on the light illumination surface side (back surface side).

The signal scanning circuit includes the above-mentioned amplification transistor (not shown) and the like formed in an interlayer dielectric film 31-1 formed on the semiconductor substrate 30 on the signal scanning circuit formation surface side, and an interconnecting layer 37.

The semiconductor substrate 30 is, e.g., an n-type semiconductor layer formed on an SOI substrate by epitaxial growth. In this embodiment, the film thickness of the semiconductor substrate 30 is, e.g., about 3.5 μm.

The photodiode PD is formed in the semiconductor substrate 30, and performs photoelectric conversion.

The hole storage layer 35 is formed by the p-type amorphous silicon carbide layer (a-SiC(p) layer) 33 near an interface BF between the semiconductor substrate 30 on the light illumination surface side and the silicon oxide film 34. The hole storage layer 35 can increase the hole concentration near the interface BF, and suppress the depletion of the interface. This makes it possible to suppress a dark current generated near the interface BF.

The silicon oxide film ($SiO_2$ film) 34 is formed on the semiconductor substrate 30 on the light illumination surface side, and desirably has a film thickness $dSiO_2$ of about 2 nm (inclusive) to 0.1 μm (100 nm) (inclusive) as will be described later.

The p-type amorphous silicon carbide layer (a-SiC(p) layer) 33 is formed on the $SiO_2$ film 34, and normally has a bandgap (about 2.0 eV) wider than the bandgap (about 1.1 eV) of silicon (Si). The a-SiC(p) layer 33 has a short-wavelength-light absorption coefficient smaller than that of silicon (Si), and hence can suppress the decrease in sensitivity to blue (B) light (e.g., 450 nm). Also, the deposition temperature when forming the a-SiC(p) layer 33 is a relatively low temperature of about 230° C. as will be described later. This is advantageous in that the a-SiC(p) layer 33 can be formed after the formation of the interconnecting layer 37 made of, e.g., Al (aluminum) or Cu (copper), without deteriorating the interconnection characteristic of the interconnecting layer 37.

Since the a-SiC(p) layer 33 is a p-type semiconductor layer, the hole storage layer 35 can be formed near the interface BF. The a-SiC(p) layer 33 desirably has a film thickness by which the hole storage layer 35 can be formed (the depletion of the interface BF can be prevented). If the film thickness of the a-SiC(p) layer 33 is extremely large, however, electrons generated in the region by photoelectric conversion may recombine and decrease blue (B). In this embodiment, therefore, the film thickness of the a-SiC(p) layer 33 is preferably, e.g., about 30 nm or less. The B (boron) concentration of a-SiC(p) is preferably a concentration that prevents the depletion of the interface BF and its vicinity of the semiconductor substrate on the light illumination surface side and sufficiently decreases the dark current, e.g., about $1E17\ cm^{-3}$ (inclusive) to $1E20\ cm^{-3}$ (inclusive).

It is more desirable to apply a voltage VSiC to the a-SiC(p) layer 33 by a voltage controller (not shown) or the like via the pixel separating layer 36, so that the a-SiC(p) layer 33 is grounded to a ground power supply voltage (GND). This is so because the hole storage layer 35 having higher stability can be formed by controlling the hole concentration in the hole storage layer 35 by applying the voltage VSiC.

The planarizing layer 32 is formed on the a-SiC(p) 33 on the light illumination surface side. In this embodiment, the planarizing layer 32 is made of, e.g., a silicon oxide film ($SiO_2$ film).

The color filter CF is formed in an interlayer dielectric film 31-2 on the light illumination surface side. In the Bayer arrangement, for example, the color filter CF is formed to correspond to one of R (Red), G (Green), and B (Blue).

The microlens ML is formed on the interlayer dielectric film 31-2 on the light illumination surface side.

The interconnecting layer 37 is formed in the interlayer dielectric film 31-1 on the signal scanning circuit formation side by using, e.g., Al (aluminum) or Cu (copper).

Note that although not shown, a passivation film or the like may be formed on the interlayer dielectric film 31-1 on the back surface side by using, e.g., an $Si_3N_4$ film.

1-4. Hole Generation Etc.

Hole generation and the like in the vicinity of the interface BF of the solid-state image sensing device according to this embodiment will be explained below with reference to FIGS. 4 and 5.

1-4-1.

(Characteristic 1) First, a one-dimensional concentration distribution (the hole, donor, and acceptor concentrations) and the potential in the direction of depth from the surface of the semiconductor substrate 30 on the front surface side to the vicinity of the interface BF will be explained with reference to FIG. 4.

As indicated by the broken lines, in the vicinity of the interface BF between the semiconductor substrate 30 on the light illumination surface side and the silicon oxide film 34, the hole storage layer 35 formed by the a-SiC(p) layer 33 stores holes. Therefore, a dark current generated near the interface BF can be suppressed by suppressing depletion by increasing the hole concentration near the interface BF.

(Characteristic 2) Next, the hole concentration in the section from the surface (on the photodiode PD side) of the semiconductor substrate 30 on the front surface side to the vicinity of the interface BF will be explained below with reference to FIG. 5.

Figure 5:
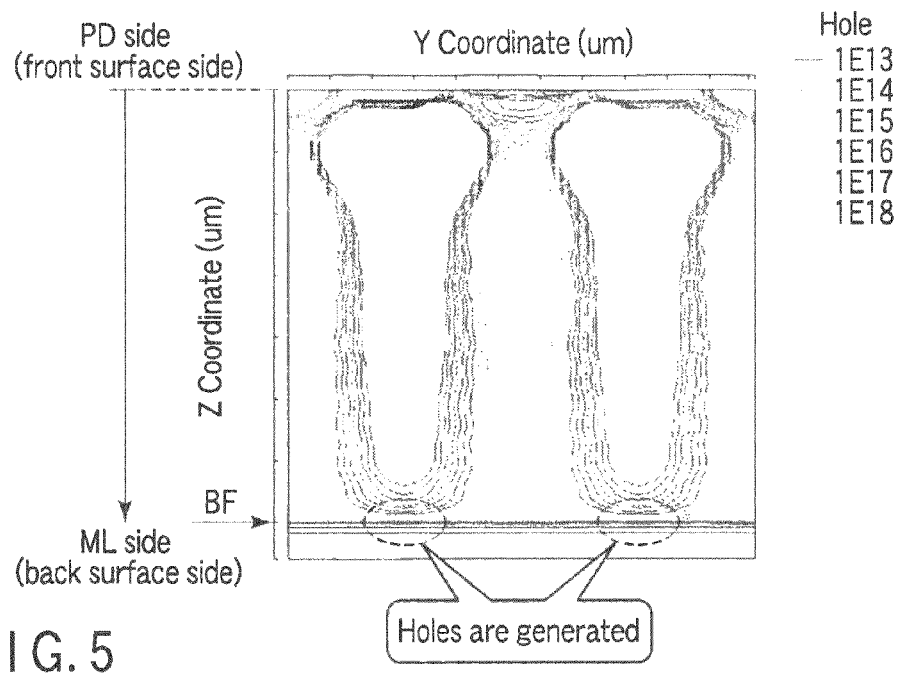
FIG. 5 is a graph showing the hole concentration in the section from the semiconductor substrate surface to the vicinity of the interface in the solid-state image sensing device according to the first embodiment.

As shown in FIG. 5, many holes are generated near the interface BF, and the hole concentration is $1E16\ cm^{-3}$ or more, i.e., no depletion occurs on the light illumination surface side. Accordingly, it is obviously possible to suppress the dark current generated near the interface BF.

1-4-2. Relationship Between B Concentration in a-SiC(p) Layer and Dark Current

Figure 6:
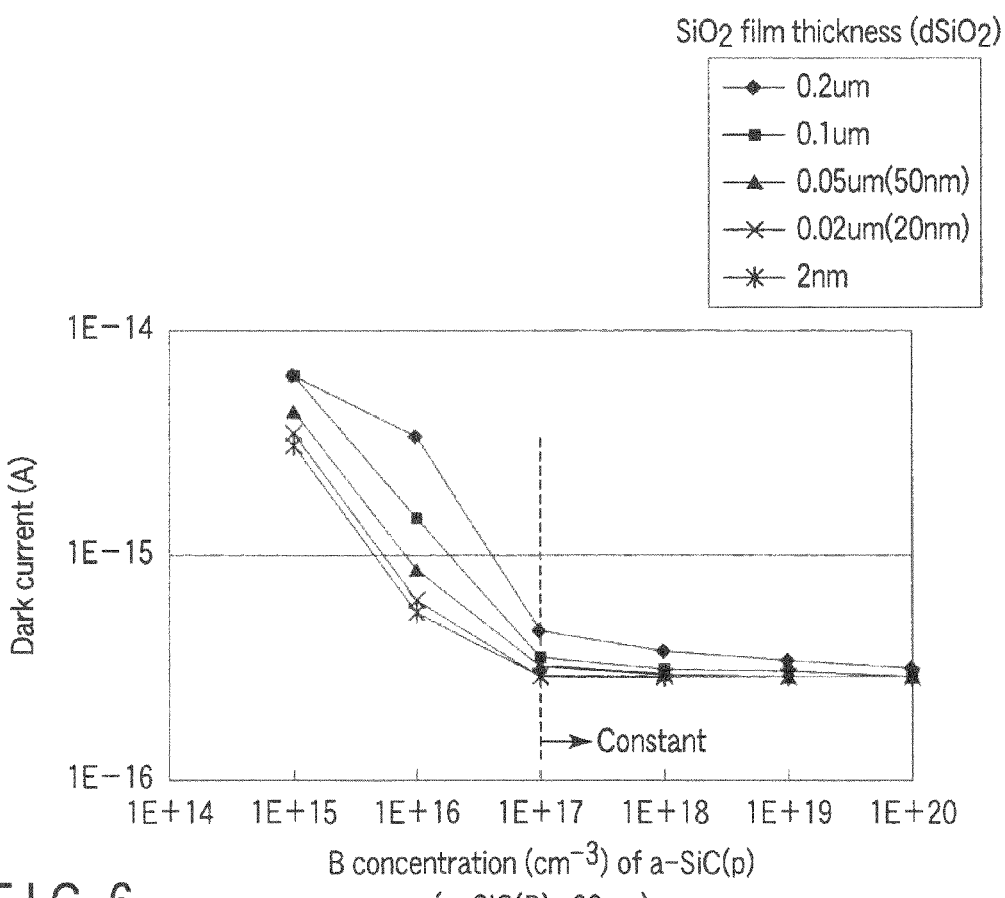
FIG. 6 is a graph showing the relationship between the B (boron) concentration in an a-SiC(p) layer and a dark current, by using, as a parameter, the film thickness ($dSiO_2$) of an Si oxide film of the solid-state image sensing device according to the first embodiment.

The relationship between the B (boron) concentration in the a-SiC(p) layer and the dark current will be explained below with reference to FIG. 6. FIG. 6 shows the B (boron) concentration in the a-SiC(p) layer 33 formed in this embodiment and the dark current, by using the film thickness ($dSiO_2$) of the Si oxide film 34 as a parameter.

As shown in FIG. 6, the dark current decreases as the B concentration in the a-SiC(p) layer 33 increases. Also, the smaller the film thickness ($dSiO_2$) of the Si oxide film 34, the lower the dark current. When the B concentration is about $1E17\ cm^{-3}$ or more, the dark current is suppressed and almost constant, i.e., converged. This result demonstrates that the B concentration in the a-SiC(p) layer 33 is preferably $1E17\ cm^{-3}$ (inclusive) to $1E20\ cm^{-3}$ (inclusive), and the film thickness ($dSiO_2$) of the Si oxide film 34 is preferably 2 nm (inclusive) to 0.1 μm (100 nm) (inclusive).

<2. Manufacturing Method>

A method of manufacturing the solid-state image sensing device according to the first embodiment will be explained below with reference to FIGS. 7, 8, 9, and 10.

First, a semiconductor substrate (Si-sub) 30 is formed by epitaxially growing an n-type semiconductor layer by, e.g., about 3.5 μm on an SOI (Silicon On Insulator) substrate. Then, a pixel separating layer 36, photodiodes PD, an interlayer dielectric film 31-1, and interconnecting layers 37 are formed on the semiconductor substrate 30 on the signal scanning line side (front surface side) by using a well-known CMOS sensor manufacturing method.

Subsequently, steps of manufacturing a back side illumination solid-state image sensing device are performed.

Figure 7:
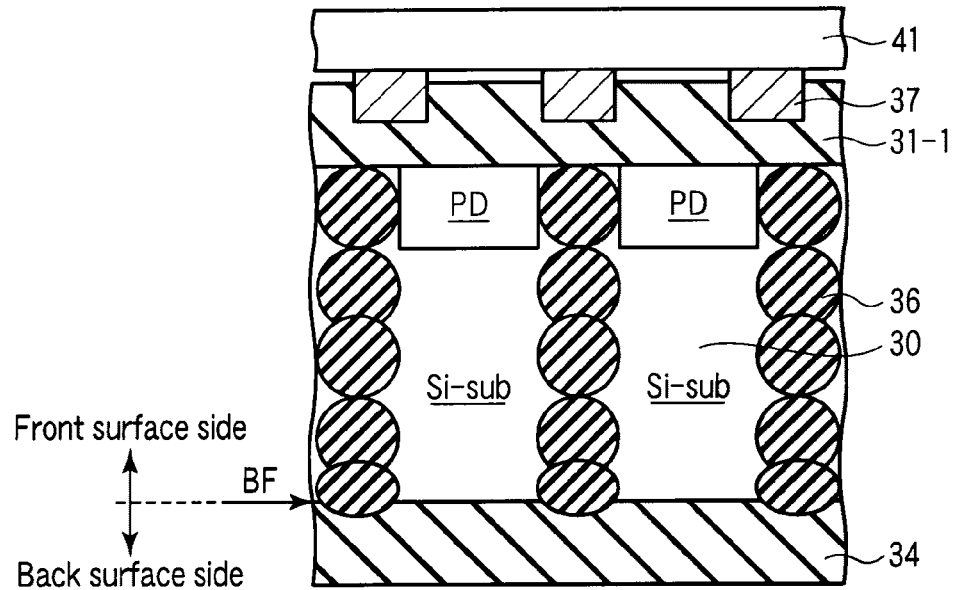
FIG. 7 is a view showing a manufacturing step of the solid-state image sensing device according to the first embodiment.

More specifically, as shown in FIG. 7, a support substrate 41 is adhered to the interconnecting layers 37 and interlayer dielectric film 31-1 on the signal scanning line side (front surface side) by using an adhesive or a direct bonding method.

Then, a silicon substrate of the SOI substrate on the light illumination surface side (back surface side) is removed to a desired thickness, and polished by using, e.g., CMP (Chemical Mechanical Polishing), thereby leaving only an oxide layer 34 of the SOI substrate behind. If the film thickness of the Si oxide layer (SOI layer) 34 is still larger than the desired film thickness, the Si oxide layer 34 is thinned to the desired film thickness (e.g., about 50 nm) by using, e.g., $NF_4OH$, HF, or a solution mixture of HF, $HNO_3$, and $CH_3COOH$ as needed. The above-described process of thinning the Si oxide layer 34 need not be performed if an SOI substrate in which the film thickness of the Si oxide layer 34 is 0.1 μm (about 100 nm) or less is used from the beginning.

Next, a step of forming an a-SiC(p) layer 33 will be explained.

Figure 8:
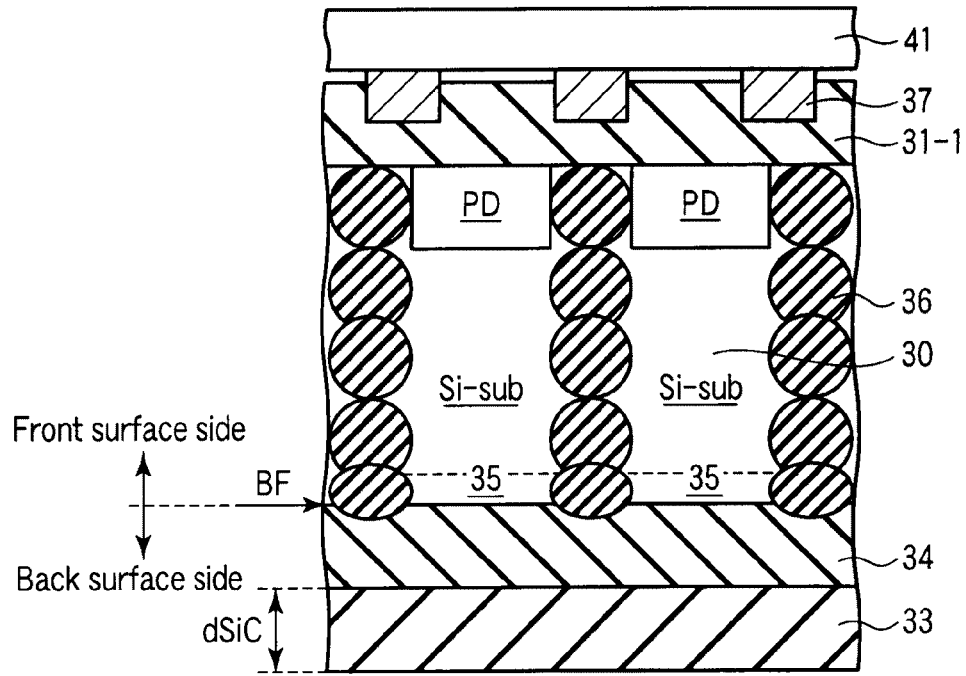
FIG. 8 is a view showing another manufacturing step of the solid-state image sensing device according to the first embodiment.

More specifically, as shown in FIG. 8, a p-type amorphous silicon carbide (a-SiC(p)) layer 33 about 30 nm thick is formed by using, e.g., plasma CVD on the Si oxide film 34 left behind as a thin film on the light illumination surface side by the above-mentioned step.

FIG. 9 shows a list of the deposition conditions and film characteristics in the step of forming the a-SiC(p) layer 33. As shown in FIG. 9, deposition is performed by supplying $SiH_4$ gas=100 [SCCM], $H_2$ gas=50 [SCCM], $CH_4$ gas=20 [SCCM], and $B_2H_6$ gas=8 [SCCM] at a pressure of 0.5 [Torr], a power of 30 [W/cm$^2$], and a substrate temperature of 230° C. for about 2 min and 30 sec. Under the conditions, the p-type amorphous silicon carbide layer 33 about 30 nm thick can be formed.

As described above, the deposition temperature is a relatively low temperature of about 230° C. in the step of forming the a-SiC(p) layer 33 of this embodiment. Therefore, even after the interconnecting layer 34 made of Al or Cu is formed, the a-SiC(p) layer 33 can be formed without deteriorating the interconnection characteristic of the interconnecting layer 34. As shown in FIG. 9, the bandgap of the a-SiC(p) layer 33 is about 2.0 eV normally wider than the bandgap (1.1 eV) of Si. Also, the short-wavelength-light absorption coefficient of the a-SiC(p) layer 33 is smaller than that of Si. Accordingly, the decrease in sensitivity to B (blue) light (e.g., 450 nm) can be suppressed.

In addition, the a-SiC(p) layer 33 is a p-type semiconductor layer. When the a-SiC(p) layer 33 is formed, therefore, the hole storage layer 35 can be formed near the interface BF of the semiconductor substrate 30 on the light illumination surface side. This makes it possible to suppress the dark current or the like near the interface BF of the semiconductor substrate 30.

Subsequently, as shown in FIG. 10, an Si oxide film or the like is formed on the a-SiC(p) layer 33 on the light illumination surface side (back surface side), thereby forming a planarizing layer 32. After that, an interlayer dielectric film 32-1 is formed on the planarizing layer 32 on the back surface side, and color filters CF are formed in the interlayer dielectric film 31-1 by using an organic material or the like. A passivation film (not shown) made of an $Si_3N_4$ film is formed on the interlayer dielectric film 31-1 on the back surface side. Microlenses ML are formed on the interlayer dielectric film 31-1 on the back surface side, and the support substrate 41 is removed after that. Thus, the back side illumination solid-state image sensing device shown in FIG. 3 can be manufactured.

Note that the first embodiment has been explained by taking, as an example, a substrate formed by epitaxially growing an n-type silicon (Si) film on an SOI substrate, but the present invention is not limited to this. For example, the present invention is similarly applicable even when using, e.g., a bulk Si substrate or SIMOX substrate, instead of an SOI substrate.

<3. Effects>

The solid-state image sensing device and the method of manufacturing the same according to the first embodiment can achieve at least effects (1) to (3) below.

(1) The dark current can be reduced by preventing the depletion of the substrate interface BF on the light illumination surface side.

As described above, the solid-state image sensing device according to this embodiment is a back side illumination solid-state image sensing device which includes the pixel region 12 where the plurality of pixels 1 each including the photoelectric converter (PD) and signal scanning circuit (e.g., Ta) are arranged on the semiconductor substrate 30, and in which a light illumination surface is formed on the substrate surface opposite to the surface of the semiconductor substrate 30 on which the signal scanning circuit (e.g., Ta) is formed. Furthermore, the solid-state image sensing device according to this embodiment includes the silicon oxide film 34 formed on the semiconductor substrate on the light illumination surface side, the p-type amorphous silicon carbide layer (a-SiC (p) layer) 33 formed on the silicon oxide layer 34, and the hole storage layers 35 formed by the p-type amorphous silicon carbide layer 33 in the vicinity of the interface BF between the semiconductor substrate 30 on the light illumination surface side and the silicon oxide film 34.

In the above-mentioned arrangement, the hole storage layers 35 formed by the p-type amorphous silicon carbide layer 33 can be arranged near the interface BF that has many defects and can be a dark current generation source. This makes it possible to reduce the dark current by suppressing depletion by increasing the hole concentration in the interface BF.

(2) The hole storage layers 35 having higher stability can be formed.

In the solid-state image sensing device according to this embodiment, the ground power supply voltage (GND) is applied as the voltage VSiC to the p-type amorphous silicon carbide layer 33 via the pixel separating layer 36. The voltage VSiC can be applied by, e.g., a voltage controller (not shown).

Since the hole concentration can be controlled by applying the voltage VSiC as described above, the hole storage layers 35 having higher stability can be formed.

(3) Deterioration of the reliability of the interconnecting layer 37 can be prevented.

As described previously, the deposition temperature when forming the a-SiC(p) layer 33 is a relatively low temperature of about 230° C. Therefore, even when forming the a-SiC(p) layer 33 after the formation of the interconnecting layer 37 made of, e.g., Al (aluminum) or Cu (copper), the a-SiC(p) layer 33 can be formed without deteriorating the interconnection characteristic of the interconnecting layer 37. Accordingly, deterioration of the reliability of the interconnecting layer 37 can be prevented.

[Second Embodiment (Example Including Transparent Electrode Layer)]

Figure 11:
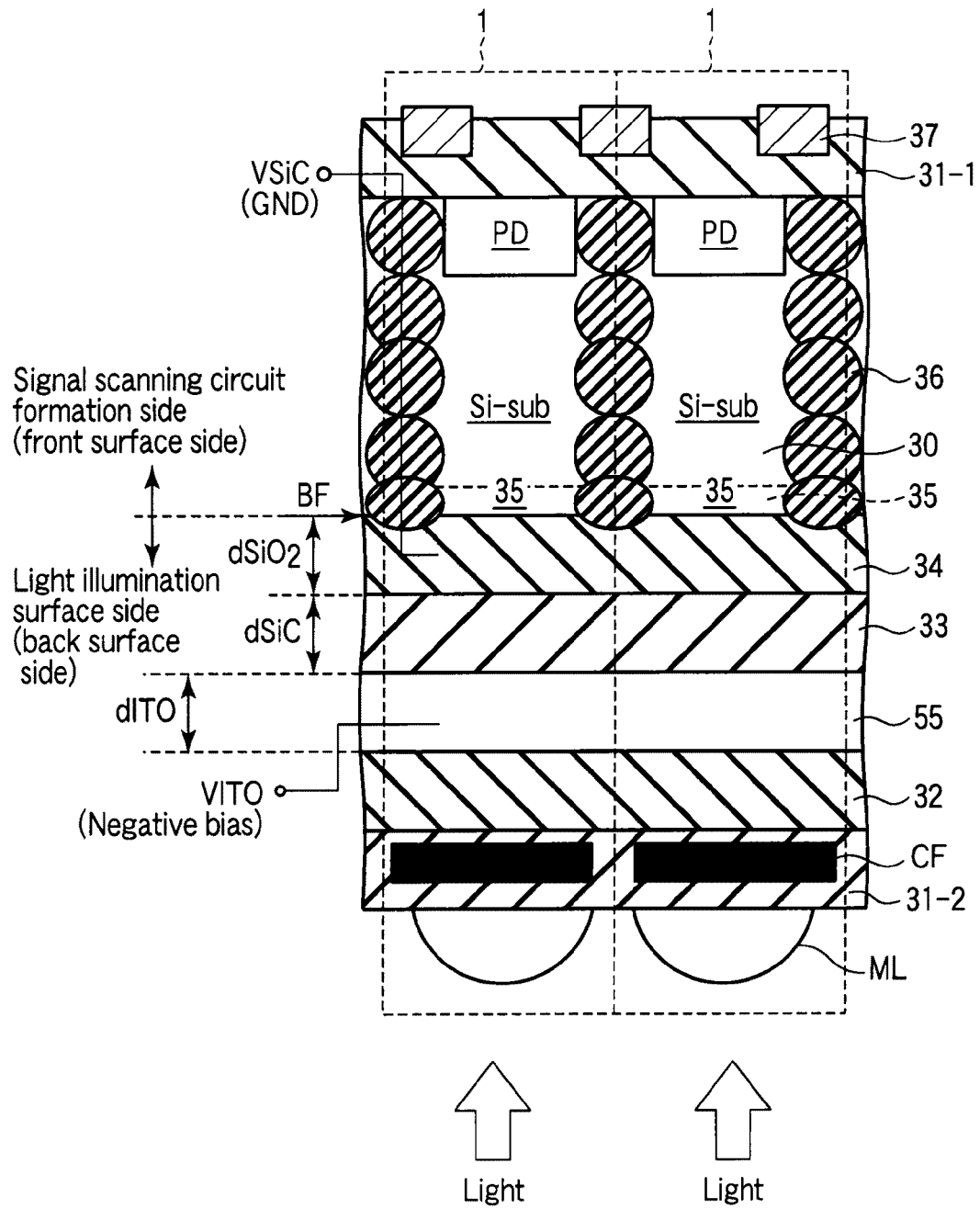
FIG. 11 is a sectional view showing a sectional structure example of a solid-state image sensing device according to the second embodiment.

A solid-state image sensing device according to the second embodiment will be explained below with reference to FIG. 11. This embodiment is directed to an example further including a transparent electrode layer. In the following description, a repetitive explanation of the same portions as those of the above-mentioned first embodiment will be omitted.

<Configuration Example>

First, a configuration example of the solid-state image sensing device according to the second embodiment will be explained with reference to FIG. 11. As shown in FIG. 11, this embodiment differs from the first embodiment in that a transparent electrode layer 55 is further formed on an a-SiC(p) layer 33 on the light illumination surface side (back surface side).

In this embodiment, the transparent electrode layer 55 is made of, e.g., an ITO (Indium Tin Oxide) film about 35 nm thick. It is favorable to make it possible to apply a predetermined voltage VIT0 to the transparent electrode layer 55. When driving the device, a negative bias (e.g., about −2 V) is preferably applied as the voltage VIT0 to the transparent electrode layer 55. The voltage VIT0 can be applied from, e.g., the above-mentioned voltage controller. Accordingly, the hole density near an interface BF can be controlled more accurately.

<Manufacturing Method>

A method of manufacturing the solid-state image sensing device according to the second embodiment will be explained below. This manufacturing method is not shown in the drawings.

First, a p-type amorphous silicon carbide layer (a-SiC(p) layer) 33 is formed by, e.g., about 30 nm by using the same manufacturing method as that of the first embodiment described above.

Then, an ITO (Indium Tin Oxide) film about 35 nm thick is deposited on the p-type amorphous silicon carbide layer (a-SiC(p) layer) 33 by using chemical reactive sputtering, thereby forming a transparent electrode layer 35. More specifically, the ITO film is formed by sputtering by holding a pressure of 0.8 Pa while supplying Ar gas at 100 sccm and oxygen at 20 sccm.

Subsequently, a planarizing layer 32, an interlayer dielectric film 31-1, color filters CF, and microlenses ML are formed by using practically the same manufacturing steps as described previously, thereby manufacturing the back side illumination solid-state image sensing device shown in FIG. 11.

<Effects>

The solid-state image sensing device and the method of manufacturing the same according to the second embodiment achieve at least the same effects as effects (1) to (3) described above.

In addition, this embodiment differs from the above-mentioned first embodiment in that the transparent electrode layer 55 is further formed on the a-SiC(p) layer 33 on the light illumination surface side (back surface side).

It is favorable to make it possible to apply the predetermined voltage VIT0 to the transparent electrode layer 55. When driving the device, a negative bias (e.g., about −2 V) is preferably applied as the voltage VIT0 to the transparent electrode layer 55. The voltage VIT0 can be applied from, e.g., the above-mentioned voltage controller. Therefore, the hole density near the interface BF can be controlled more accurately.

[Third Embodiment (Example of a-SiN(p)]

A solid-state image sensing device according to the third embodiment will be explained below with reference to FIG. 12. This embodiment is directed to an example of the application of a p-type amorphous silicon nitride layer (a-SiN(p)) 77. In the following description, a repetitive explanation of the same portions as those of the aforementioned first embodiment will be omitted.

[Configuration Example]

Figure 12:
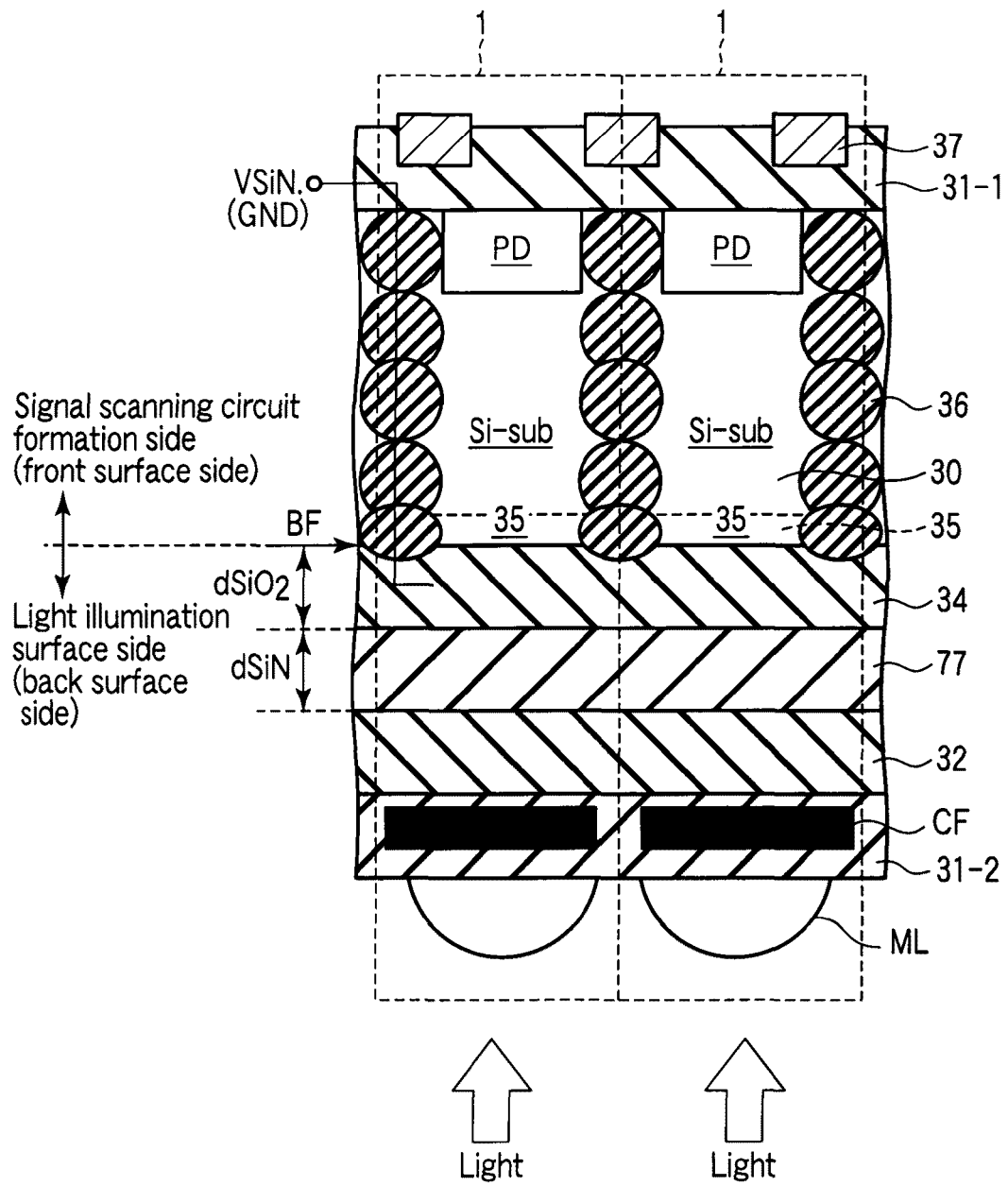
FIG. 12 is a sectional view showing a sectional structure example of a solid-state image sensing device according to the third embodiment.

As shown in FIG. 12, this embodiment differs from the first embodiment in that the p-type amorphous silicon nitride layer (a-SiN(p) layer) 77 is formed instead of the a-SiC(p) layer 33 described in the first embodiment.

<Manufacturing Method>

The difference of the manufacturing method from that of the first embodiment is that $NH_3$ gas is used instead of methane gas ($CH_4$) in the step of forming the a-SiN(p) layer 77. Consequently, a desired a-SiN(p) layer 77 can be formed.

<Effects>

The solid-state image sensing device and the method of manufacturing the same according to the third embodiment achieve at least the same effects as effects (1) to (3) described previously. In addition, the a-SiN(p) layer 77 can be applied as needed as in this embodiment. Also, it is similarly effective to form the transparent electrode layer 55 described in the second embodiment on the a-SiN(p) layer 77 on the back surface illumination side (back surface side).

Note that in the first to third embodiments described above, the silicon oxide film 34 is not limited to a silicon oxide film left behind by using an SOI substrate, and includes, e.g., a native oxide film about 2 nm thick when using a bulk substrate or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A back side illumination solid-state image sensing device, comprising:
    a pixel region where a plurality of pixels each including a photoelectric converter and a signal scanning circuit are arranged on a first surface of a semiconductor substrate, and a light is illuminated on a second surface of the semiconductor substrate, which is opposite to the first surface;
    a silicon oxide film formed on the second surface of the semiconductor substrate;
    a p-type amorphous silicon compound layer formed on a surface of the silicon oxide film facing the light; and
    a hole storage layer formed by the p-type amorphous silicon compound layer near an interface between the second surface of the semiconductor substrate and the silicon oxide film.

2. The device of claim 1, further comprising:
    a pixel separating layer which separates the pixels from each other; and
    a controller which applies a voltage to the p-type amorphous silicon compound layer through the pixel separating layer.

3. The device of claim 2, further comprising a transparent electrode layer formed on the p-type amorphous silicon compound layer and to which the controller applies a negative bias.

4. The device of claim 1, wherein the p-type amorphous silicon compound layer comprises one of a p-type amorphous silicon carbide layer and a p-type amorphous silicon nitride layer.

5. The device of claim 4, wherein
a boron concentration in the p-type amorphous silicon carbide layer is 1E17 $cm^{-3}$ (inclusive) to 1E20 $cm^{-3}$ (inclusive), and
a film thickness of the silicon oxide film is 2 nm (inclusive) to 100 nm (inclusive).

6. The device of claim 1, wherein the pixel comprises:
a photodiode which forms the photoelectric converter; and
an amplification transistor, a read transistor, a reset transistor, and an address transistor which form the signal scanning circuit.

7. The device of claim 1, further comprising a vertical shift register which selects the pixels for each row.

8. The device of claim 1, further comprising an analog-to-digital converter which converts, into a digital signal, an analog signal output from each pixel of a selected row and corresponding to an amount of incident light.

9. A solid-state image sensing device manufacturing method comprising:
forming a semiconductor layer on an SOI substrate;
forming a photodiode, an interlayer dielectric film, and an interconnecting layer in the semiconductor layer on a signal scanning line side;
adhering a support substrate on the interlayer dielectric film on the signal scanning line side;
removing the semiconductor substrate on a light illumination surface side opposite to the signal scanning line side, by using an insulating layer in the SOI substrate as a stopper;
forming a p-type amorphous silicon compound layer on the insulating layer remaining on the light illumination surface side, and forming a hole storage layer by the p-type amorphous silicon compound layer near an interface between the semiconductor layer on the light illumination surface side and the insulating layer;
forming a planarizing layer on the p-type amorphous silicon compound layer;
forming an interlayer dielectric film on the planarizing layer, and forming a color filter in the interlayer dielectric film; and
forming a microlens on the interlayer dielectric film on the light illumination surface side.

10. The method of claim 9, further comprising:
forming, in the semiconductor layer, a pixel separating layer which separates pixels; and
applying, by a controller, a voltage to the p-type amorphous silicon compound layer through the pixel separating layer.

11. The method of claim 10, further comprising forming a transparent electrode layer on the p-type amorphous silicon compound layer and to which the controller applies a negative bias.

12. The method of claim 9, wherein the p-type amorphous silicon compound layer comprises one of a p-type amorphous silicon carbide layer and a p-type amorphous silicon nitride layer.

13. The method of claim 12, wherein
a boron concentration in the p-type amorphous silicon carbide layer is 1E17 $cm^{-3}$ (inclusive) to 1E20 $cm^{-3}$ (inclusive), and
a film thickness of the silicon oxide film is 2 nm (inclusive) to 100 nm (inclusive).

14. The method of claim 9, further comprising decreasing a film thickness of the insulating film in the SOI substrate by using a material selected from the group consisting of $NF_4OH$, HF, and a solution mixture of HF, $HNO_3$, and $CH_3COOH$.

* * * * *